United States Patent
Huang et al.

[11] Patent Number: 6,157,065
[45] Date of Patent: Dec. 5, 2000

[54] ELECTROSTATIC DISCHARGE PROTECTIVE CIRCUIT UNDER CONDUCTIVE PAD

[75] Inventors: Tsuy-Hua Huang, Hsinchu Hsien; Hung-Ting Chen, Miao-Li Hsien; Chia-Hsing Chao, Changhua; Chun-Jing Horng, Hsinchu, all of Taiwan

[73] Assignee: United Microelectronics Corp., Taiwan

[21] Appl. No.: 09/232,204

[22] Filed: Jan. 14, 1999

[51] Int. Cl.$^7$ ................................................ H01L 23/62
[52] U.S. Cl. .................... 257/355; 257/356; 257/357; 257/360; 257/367; 257/369; 257/388; 257/401; 257/204; 257/173
[58] Field of Search ................................ 257/355, 356, 257/357, 401, 360, 367, 388, 369, 173, 204

[56] References Cited

U.S. PATENT DOCUMENTS

| | | | |
|---|---|---|---|
| 5,516,717 | 5/1996 | Hsu | 437/56 |
| 5,517,048 | 5/1996 | Kosaka | 257/355 |
| 5,646,808 | 7/1997 | Nakayama | 361/56 |
| 5,721,439 | 2/1998 | Lin | 257/204 |
| 5,838,043 | 11/1998 | Yuan | 257/355 |
| 5,962,876 | 10/1999 | Yu | 257/133 |
| 6,025,631 | 2/2000 | Lin | 257/355 |
| 6,064,093 | 5/2000 | Ohita | 257/355 |
| 6,064,094 | 5/2000 | Infrater | 257/355 |
| 6,064,095 | 5/2000 | Fu | 257/355 |

*Primary Examiner*—Matthew Smith
*Assistant Examiner*—Belur Keshavan
*Attorney, Agent, or Firm*—Thomas, Kayden, Horstemeyer & Risley, L.L.P.

[57] ABSTRACT

An electrostatic discharge protective circuit under an input pad. The electrostatic discharge protective circuit has at least a MOS, wherein the MOS comprises a drain region, a gate structure and a source region. A metal silicon layer is on the gate structure and the source region, wherein the gate structure and the source region are coupled to each other through the metal silicon layer. A dielectric layer is over the drain region, the gate structure and the source region. A metal layer is over the dielectric layer. A via plug is in the dielectric layer, wherein the drain and the conductive layer are coupled to each other through the via plug. An input pad is over the MOS, wherein the metal layer is coupled to an input port and an internal circuit through the input pad.

8 Claims, 5 Drawing Sheets

ELECTROSTATIC DISCHARGE PROTECTIVE CIRCUIT UNDER CONDUCTIVE PAD

BACKGROUND OF THE INVENTION

1. Field of the Invention

The present invention relates to an electrostatic discharge protective circuit. More particularly, the present invention relates to an electrostatic discharge protective circuit under a conductive pad.

2. Description of the Related Art

Electrostatic discharge (ESD) is one of the major ways for an integrated circuit (IC) to be damaged in an IC fabrication process. This is especially true for fabrication of a deep sub-micron IC. In order to overcome the problems caused by static electricity, an ESD protective circuit is incorporated on the input/output (I/O) pads of a complementary metal-oxide-semiconductor (CMOS) IC through an on-chip method. However, the protection provided by the ESD protective circuit becomes less effective as the line width of the semiconductor fabrication process is downsized.

FIG. 1A is a schematic circuit diagram of a conventional ESD protective circuit. As shown in FIG. 1A, in order to protect the internal circuit 10, the ESD current imported through an input port INP is discharged through an NMOS transistor N1 to a ground $V_{SS}$. FIG. 1B is a schematic circuit diagram of another conventional ESD protective circuit. As shown in FIG. 1B, in order to protect the internal circuit 10, the ESD current can be discharged not only through an NMOS transistor N1 to the ground $V_{SS}$ but also through a PMOS transistor P1 to a voltage source $V_{DD}$.

FIG. 2 is a schematic, cross-sectional view of the ESD protective circuit in FIG. 1A. As shown in FIG. 2, the NMOS transistor N1 comprises a substrate 20, a drain region 22 coupled to an input line I/P through a contact plug 24, a source region 26 coupled to the ground $V_{SS}$ through a contact plug 28 and a gate 29 between the source region 26 and the drain region 22. The gate 29 is also coupled to the ground $V_{SS}$ through a contact plug 28.

FIG. 3 is a schematic, top view of the ESD protective circuit in FIG. 2. The cross-sectional view taken along the line I–I' in FIG. 3 is denoted as FIG. 2. As shown in FIG. 3, there is an input (I/P) pad 30 beside the input line I/P. The I/P pad 30 is coupled to the input line I/P, the input port INP (as shown in FIG. 1A) and the internal circuit (as shown in FIG. 1A).

The conventional ESD protective circuit is formed beside the I/P pad 30 in a limited area. It is necessary to keep the predetermined spaces of the design rule between source region and node contact hole and between the source region and the gate, so that the area of the ESD protective circuit is large. Therefore, the size of the chip is large. For the design of Ultra Large Scale Integration (ULSI) circuit, it is important to reduce the size of the chip as the size of the device is gradually decreased.

SUMMARY OF THE INVENTION

It is therefore an objective of the invention to provide an ESD protective circuit under an input pad. The invention can decrease the size of the ESD protective circuit without reducing the ESD ability of the ESD protective circuit.

To achieve these and other advantages and in accordance with the purpose of the invention, as embodied and broadly described herein, the invention provides an ESD protective circuit under an input pad. The ESD protective circuit has at least a MOS, wherein the MOS comprises a drain region, a gate structure and a source region. A metal silicon layer is on the gate structure and the source region, wherein the gate structure and the source region are coupled to each other through the metal silicon layer. A dielectric layer is over the drain region, the gate structure and the source region. A metal layer is over the dielectric layer. A contact plug is in the dielectric layer, wherein the drain and the conductive layer are coupled to each other through the contact plug. An input pad is over the MOS, wherein the metal layer is coupled to an input port and an internal circuit through the input pad. The input pad is formed on the top of the ESD protective circuit. Additionally, the source region of the NMOS and that of the PMOS, together with the gate structure, are coupled to the ground and the voltage power, respectively, under the conductive pad. Therefore, the size of the ESD protective circuit is reduced without affecting the ESD ability of the ESD protective circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
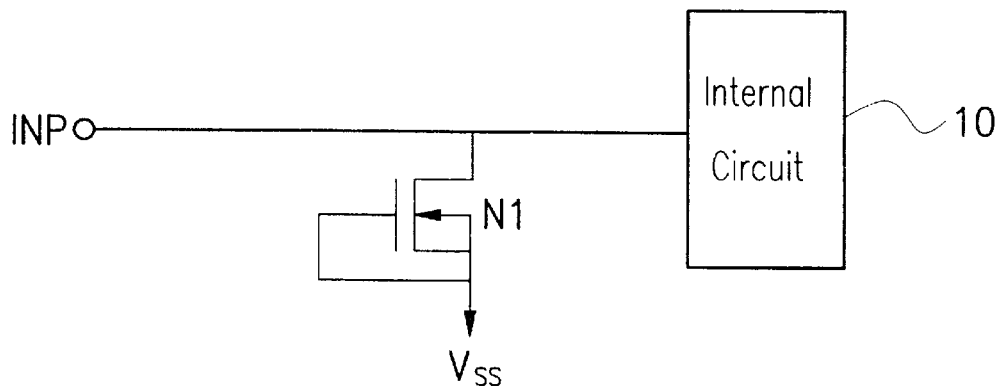
FIG. 1A is a schematic circuit diagram of a conventional ESD protective circuit.
Figure 1B:
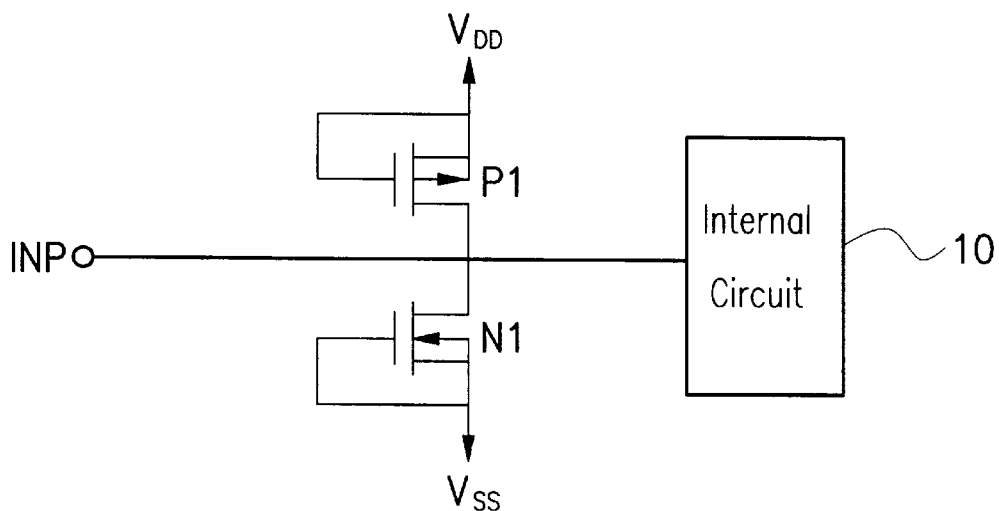
FIG. 1B is a schematic circuit diagram of another conventional ESD protective circuit.
Figure 2:
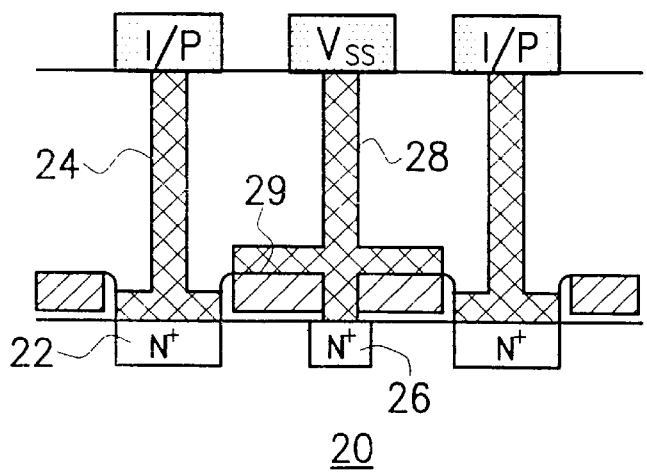
FIG. 2 is a schematic, cross-sectional view of the ESD protective circuit in FIG. 1A.
Figure 3:
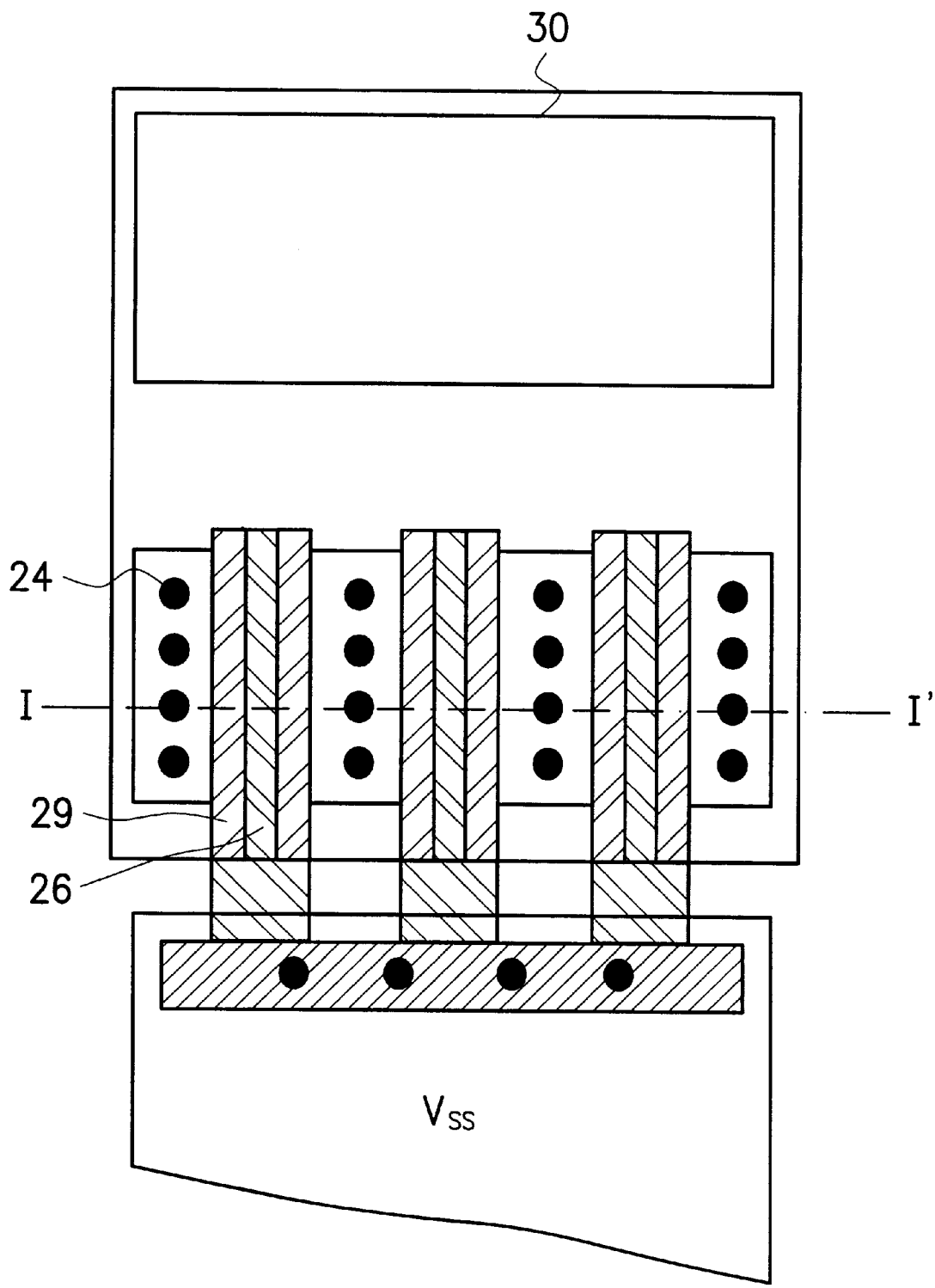
FIG. 3 is a schematic, top view of the ESD protective circuit in FIG. 2

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4E are schematic, cross-sectional views of the process for manufacturing an ESD protective circuit in a preferred embodiment according to the invention. The preferred embodiment according to the invention is denoted as an NMOS ESD protective circuit. The invention also can be applied to fabricate a PMOS ESD protective circuit.

Figure 4A:
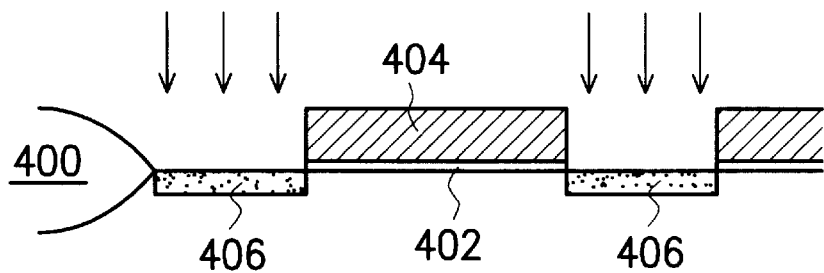
FIGS. 4A through 4E are schematic, cross-sectional views of the process for manufacturing an ESD protective circuit in a preferred embodiment according to the invention.

As shown in FIG. 4A, an isolation region 400 is formed on a substrate 40 to define a predetermined ESD protective circuit region. The isolation region can be a filled oxide layer, for example. A gate oxide layer 402 is formed on the substrate 40. A polysilicon layer 404 is formed on the gate oxide layer 402. The thickness of the polysilicon layer 404 is about 1.5–2.5 µm. The polysilicon layer 404 and the gate oxide layer 402 are patterned to expose the surface of the substrate 40. An implantation step is used to form an N-type lightly doped drain region 406a in the substrate 40 exposed by the polysilicon layer 404 and the isolation region 400. The polysilicon layer 404 and the gate oxide layer 402 are used as a gate structure.

Figure 4B:
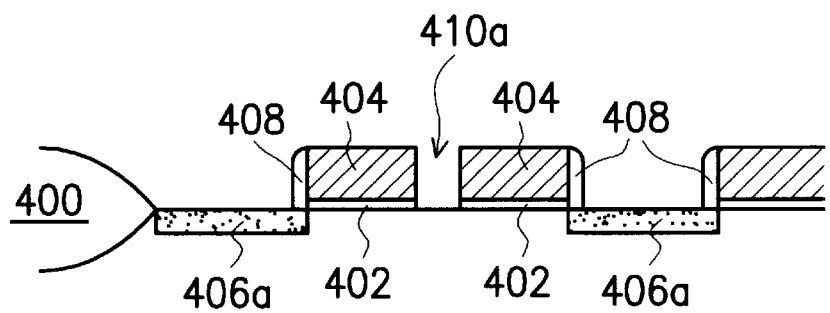

As shown in FIG. 4B, a spacer 408 is formed on the sidewalls of the polysilicon layer 404 and the gate oxide layer 402. In this example, the method of forming the spacer 408 comprises the steps of depositing an oxide layer (not shown) over the substrate 40 and removing portions of the oxide layer to form the spacer 408 on the sidewalls of the polysilicon layer 404 and the gate oxide layer 402. The polysilicon layer 404 and the gate oxide layer 402 are patterned to form an opening 410a exposing a portion of the substrate 40. The width of the opening 410a is about 0.1 µm.

Figure 4C:
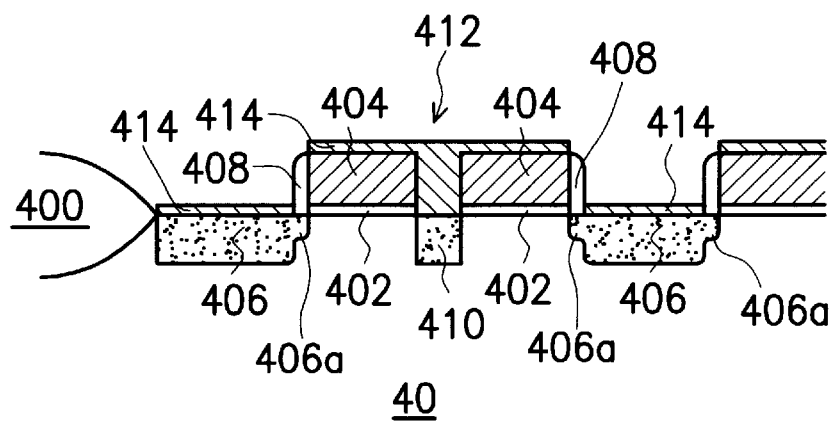

As shown in FIG. 4C, a heavy implantation step is used to form an N-type source region 410 in the substrate 40 exposed by the opening 410a and an N-type drain region 406 having the N-type, lightly doped drain region 406a. Since the width of the opening 410a is about 0.1 µm, the width of the source 410 is also about 0.1 µm. A self-aligned silicide (salicide) step is performed to form a metal silicon layer. In this example, the salicide comprises the steps of forming a titanium layer (not shown) on the polysilicon layer 404, the source region 410 and the drain region 406. A thermal process is performed to convert portions of the titanium layer into a titanium silicon layer on the polysilicon layer 404, the source region 410 and the drain region 406 beneath the titanium layer. The residual titanium layer is removed to expose the titanium silicon layer. The metal silicon layer 414 can reduce the contact resistance.

Figure 4D:
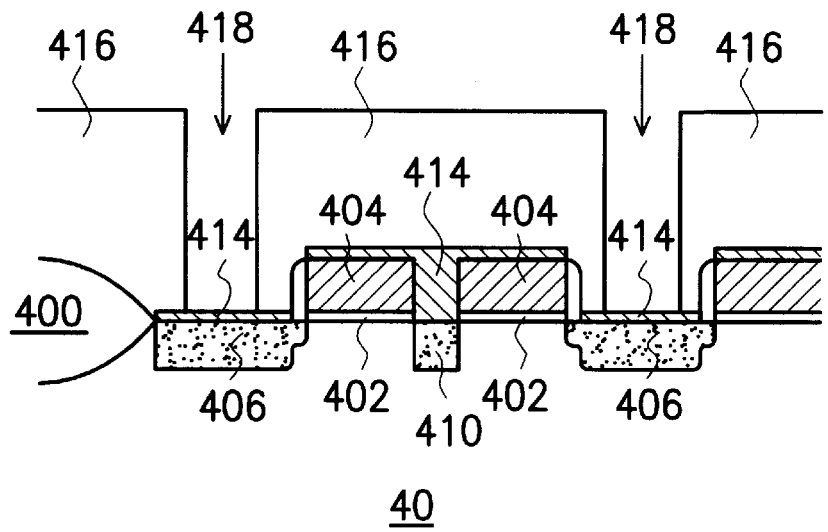

As shown in FIG. 4D, a dielectric layer 416 is formed on the metal silicon layer 414. The dielectric layer can be a tetraethosiloxane (TEOS) layer or a borophosphosilicate glass (BPSG) layer. A via hole 418 is form in the dielectric layer 416 and exposes the metal silicon layer 414 on the drain region 406.

Figure 4E:
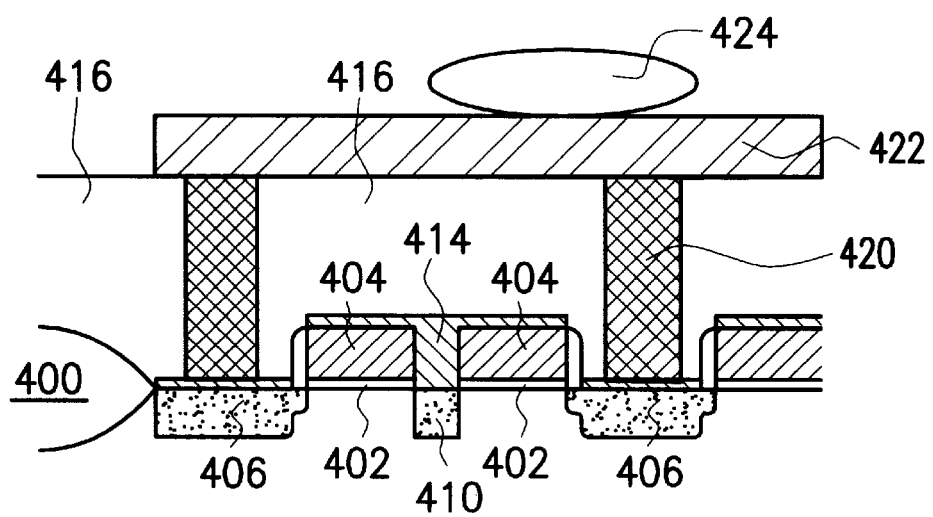

As shown in FIG. 4E, a via plug 420 is formed to fill the via hole 418. The via plug 420 can be a tungsten plug, for example. In this example, between the via plug 420 and the via hole 418 is further comprised a barrier layer (not shown) to avoid interaction between the material of the via plug 420 and that of the dielectric layer 416. The barrier layer can be a titanium/titanium nitride layer. A conductive layer 422 is formed on the dielectric layer 416 and the via plug 420. The method of forming the conductive layer can be sputtering, for example. The conductive layer 422 is coupled to the drain region 406 through the via plug 420. An input pad 424 is formed on the conductive layer 422 and is coupled to an internal circuit (not shown) and an input port (not shown). Hence, the conductive layer 422 is coupled to the internal circuit and the input port through the input pad 424. The structure of the input pad 424 coupled to the internal circuit and the input port is similar to a conventional input pad, and so it is not shown in detail in the figure.

Figure 5A:
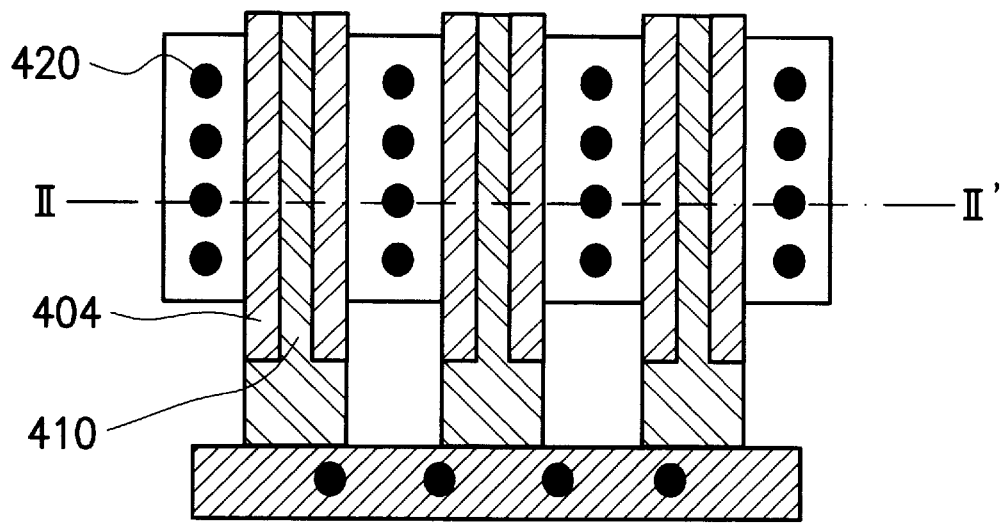
FIG. 5A is a schematic, top view of the ESD protective circuit before the conductive layer 422 is formed in FIG. 4E.

FIG. 5A is a schematic, top view of the ESD protective circuit before the conductive layer 422 is formed in FIG. 4E. The cross-sectional view taken along the line II–II' in FIG. 5A is denoted as FIG. 4E. The solid circles are denoted as the via plug 420. The hatched areas for which the hatch marks are slanted up to the left are denoted as the source region 410. The hatched areas for which the hatch marks are slanted up to the right are denoted as the polysilicon layer 404.

Figure 5B:
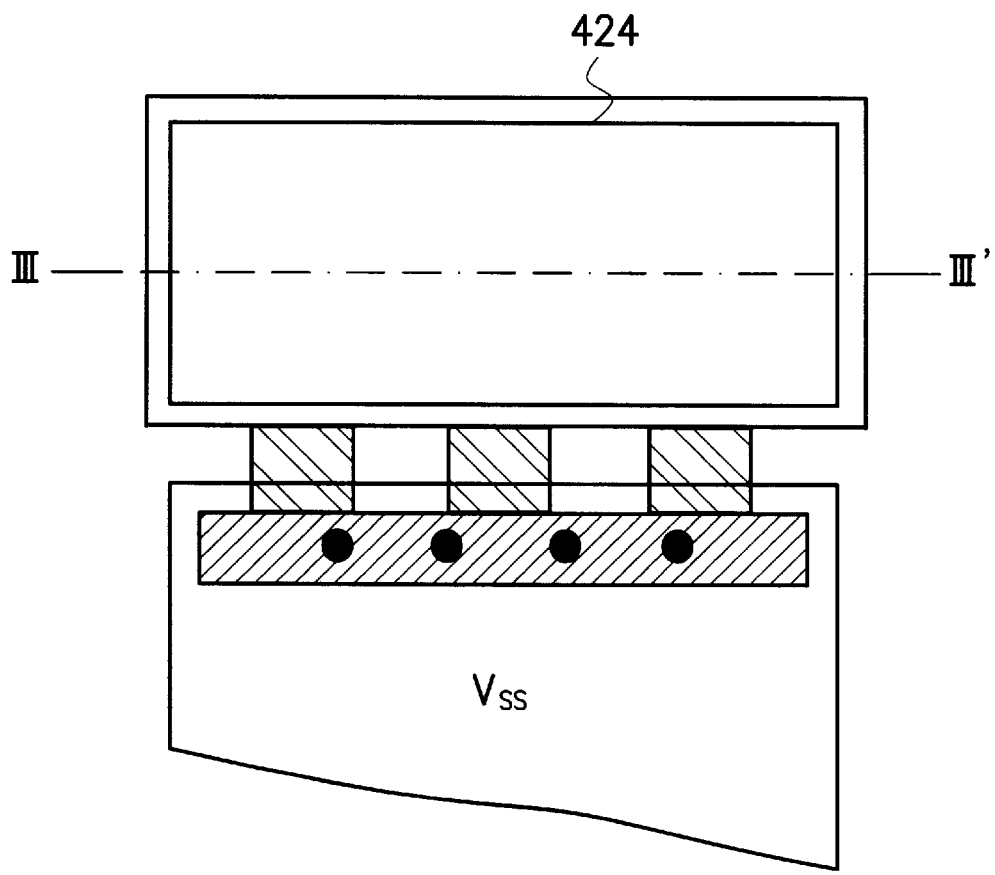
FIG. 5B is a schematic, top view of the ESD protective circuit after the input pad 424 is formed in FIG. 4E.

FIG. 5B is a schematic, top view of the ESD protective circuit after the input pad 424 is formed in FIG. 4E. The cross-sectional view taken along the line III–III' in FIG. 5B is denoted as FIG. 4E. The source region 410, together with the polysilicon 404 (as shown in FIG. 5A), is coupled to the ground $V_{SS}$ under the input pad 424 and is isolated by the dielectric layer 416 from the input pad 424. The MOS in this preferred embodiment according to the invention is denoted as an NMOS. However, when the MOS is denoted as a PMOS, the source region 410, together with the polysilicon 404, is coupled to the voltage power (not shown). Since the conductive layer 422 is formed on the via plug 420 and the dielectric layer 416, the size of the ESD protective circuit is greatly reduced. Additionally, the ESD ability of the ESD protective circuit is kept as the size of the ESD protective circuit is greatly reduced.

In the invention, the source region of the NMOS and that of the PMOS, together with the polysilicon, are coupled to the ground and the voltage power, respectively, under the conductive pad and are isolated by the dielectric layer from the conductive pad and the conductive pad is formed over the top of the ESD protective circuit, so that the size of the ESD protective circuit is decreased without affecting the ESD ability of the ESD protective circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protective circuit under a conductive pad having at least a MOS, wherein the MOS comprises a drain region, a gate structure and a source region, the electrostatic discharge protective circuit comprising:

a metal silicon layer on the gate structure and the source region, wherein the gate structure and the source region are coupled to each other through the metal silicon layer;

a dielectric layer over the drain region, the gate structure and the source region;

a metal layer over the dielectric layer;

a via plug in the dielectric layer, wherein the drain and the conductive layer are coupled to each other through the via plug; and an input pad over the MOS, wherein the metal layer is coupled to an input port and an internal circuit through the input pad.

2. The electrostatic discharge protective circuit of claim 1, wherein the MOS includes an NMOS.

3. The electrostatic discharge protective circuit of claim 2, wherein the metal silicon layer is coupled to the ground.

4. The electrostatic discharge protective circuit of claim 1, wherein the MOS includes a PMOS.

5. The electrostatic discharge protective circuit of claim 4, wherein the metal silicon layer is coupled to a voltage power.

6. The electrostatic discharge protective circuit of claim 1, wherein the metal silicon layer includes a titanium silicon layer.

7. The electrostatic discharge protective circuit of claim 1, wherein the width of the source region is about 0.1 µm.

8. The electrostatic discharge protective circuit of claim 1, wherein the thickness of the gate structure is about 1.5–2.5 µm.

* * * * *